United States Patent [19]

Koerner

[11] Patent Number: 5,066,952

[45] Date of Patent: Nov. 19, 1991

[54] NON-LINEAR DATA CONVERSION SYSTEM FOR DYNAMIC RANGE DIGITAL SIGNAL PROCESSING

[75] Inventor: Steve J. Koerner, Inyokern, Calif.

[73] Assignee: The United States of America as represented by the Secretary of the Navy, Washington, D.C.

[21] Appl. No.: 412,248

[22] Filed: Sep. 25, 1989

[51] Int. Cl.$^5$ .................. H03M 1/62; H03M 7/00; H03M 7/30

[52] U.S. Cl. ............................ 341/138; 341/95

[58] Field of Search ............. 341/138, 159, 95, 102, 341/106, 899, 108, 51, 75

[56] References Cited

U.S. PATENT DOCUMENTS

| | | | |
|---|---|---|---|
| 4,217,574 | 8/1980 | Anderson | 341/159 X |
| 4,232,302 | 11/1980 | Jagatich | 341/138 |
| 4,338,589 | 7/1982 | Engel et al. | 341/120 |
| 4,608,554 | 8/1986 | Blair | 341/75 |
| 4,614,935 | 9/1986 | Fling | 341/75 |
| 4,626,825 | 12/1986 | Burleson et al. | 341/75 |
| 4,906,995 | 3/1990 | Swanson | 341/95 |

Primary Examiner—A. D. Pellinen
Assistant Examiner—Sharon D. Logan
Attorney, Agent, or Firm—Harvey A. Gilbert; Melvin J. Sliwka; Sol Sheinbein

[57] ABSTRACT

The data acquisition portion of a data signal processing system has a non-linear data compression and conversion arrangement and a data decompression and scaling arrangement. The non-linear data compression and conversion arrangement employs graduated reference voltage levels provided by resistors having graduated, unequal values, such as values being related as a geometric progression. The graduated form of the reference voltage levels provide a form of data compression wherein large value and small value measurements will have essentially the same fractional resolution. The data decompression and scaling arrangement can decompress previously compressed digital signals and limit the digital data width of such signals in systems which have input dynamic range requirements greater than their output resolution requirements.

17 Claims, 1 Drawing Sheet

NON-LINEAR DATA CONVERSION SYSTEM FOR DYNAMIC RANGE DIGITAL SIGNAL PROCESSING

BACKGROUND OF THE INVENTION

1. Field of the Invention

The present invention generally relates to digital signal processing and, more particularly, to an enhanced data acquisition for wide dynamic range digital signal processing.

2. Description of the Prior Art

Digital processing of analog signals in systems such as radars has become widely adopted because of the advantage of component economics and inherent stability and accuracy as compared to analog signal processing. Since the output of radars are analog in nature, a converter function is employed to transform the data to a binary digital representation. The converter function is ordinarily linear in that the binary value representation at the output of the converter is directly proportional to the analog input level.

Using radar as an example, it is often the case that signals must be processed which vary widely in amplitude in order to discern characteristics of a radar signal from both distant small targets and large close targets. In the present state of the art, this situation has dictated the design and use of analog-to-digital (A/D) converters with outputs comprising a large number of bits. In many cases the bit range necessary to satisfy the dynamic range requirement is far greater than the resolution needed to discern useful characteristics of radar targets. Characteristics of a particular radar target such as doppler velocity may be discernable in an amplitude range of less than about 30 db as referenced to the maximum amplitude detected in a measurement sequence; whereas, more than 80 db of dynamic range may be required for undistorted measurements of possible targets of interest.

There are several different circuit methods for performing the A/D conversion; in general, however, there is a design tradeoff necessary between dynamic range and speed. The fastest conversion techniques are not practical for wide data width applications. Since some applications, and in particular, many radar applications, have a requirement for both wide dynamic range as well as fast conversion speeds, performance compromises are often necessitated else expensive and complex hybrid type data converters must be utilized Furthermore, when wide digital data buses are utilized a commensurate burden exists on the computational requirements to implement digital signal processing algorithms.

SUMMARY OF THE INVENTION

The present invention provides features which enhance the data acquisition portion of digital signal processing systems. These features are applicable to a broad range of such systems where the required input dynamic range of the system is greater than the required resolution at the output of the system.

One feature of the present invention is directed to a non-linear data compression and conversion arrangement. This feature can perform rapid compressed data conversion of analog signals which have wide dynamic range in amplitude into digital signals that are free of spectral distortion. This feature preferably comprises a resistive divider of graduated, unequal resistance values for non-linearly referencing an input level to a flash A/D converter.

Another feature of the present invention is directed to a data decompression and scaling arrangement located downstream of the data conversion and compression arrangement. This feature can decompress previously compressed digital signals and limit the digital data width of such signals in systems which have input dynamic range requirements greater than their output resolution requirements. This feature preferably comprises a mapping ROM for decompressing digital data in combination with a buffer memory and a scale shifter at the output of the buffer memory for scaling up or down the buffer memory output bit range.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Figure 1:
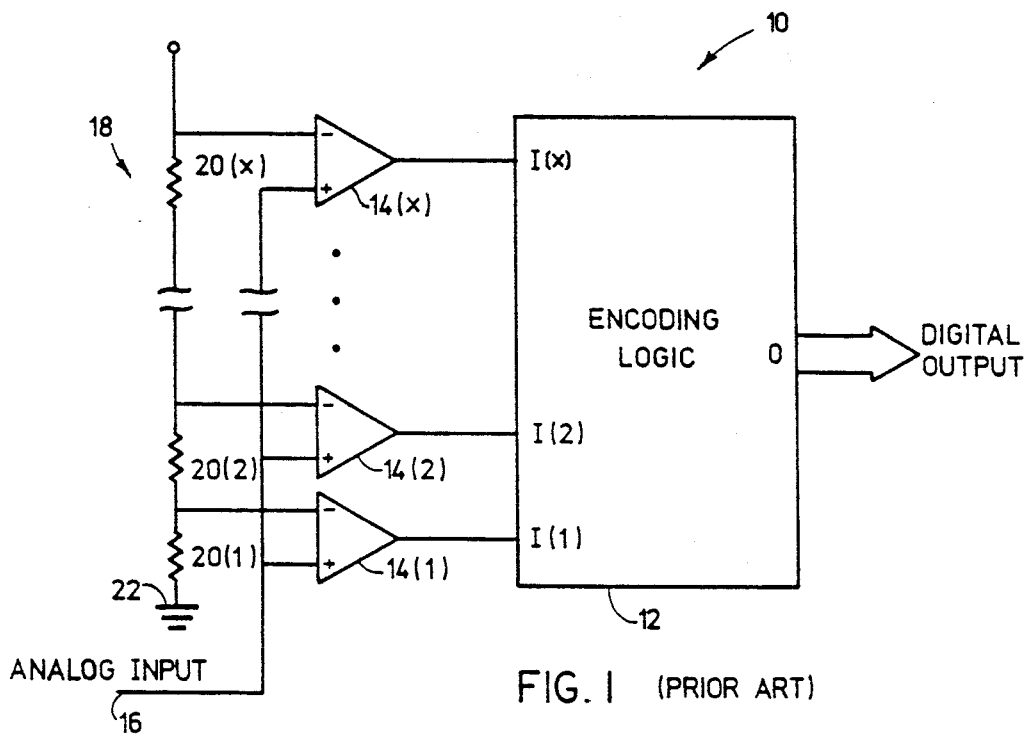
FIG. 1. is a schematic block diagram of a prior art flash A/D converter to which one feature of the present invention can be usefully applied.

Among the various conventional A/D converter technologies, the so-called parallel flash converters are the fastest. Referring to FIG. 1, there is illustrated the basic configuration of a conventional flash A/D converter, generally designated 10. The flash converter 10 includes encoding logic 12, a multiplicity of comparators 14(1), 14(2), ..., 14(x) and connected at their outputs to inputs I(1), I(2), ..., I(x) of the encoding logic 12. Each input I(1), I(2), ..., I(x) of the logic 12 will encode a different digital signal at the output O thereof.

The positive inputs of the comparators 14(1), 14(2), ..., 14(x) are connected in parallel to the same analog input voltage source 16 so that the same analog voltage appears on each comparator positive input. The negative inputs of the comparators 14(1), 14(2), ..., 14(x) are connected to different reference voltage levels. The different reference voltage levels are provided by the connections to the comparators 14(1), 14(2), ..., 14(x) of a string 18 of serially connected resistors 20(1), 20(2), ..., 20(x) which, in turn, are connected to ground 22. The resistors 20(1) to 20(x) are each of equal value and thus, for a given current, produce equal reference voltages. The reference voltages between ground 22 and the respective negative inputs of the comparators 14(1) to 14(x), therefore, increase in equal increments. For example, assuming the reference voltage at the negative input of comparator 14(1) is A, then the reference voltage at the negative input of comparator 14(2) is 2A and at the negative input of comparator 14(x) is xA. A linear A/D conversion thereby results.

Thus, it can be understood that the conventional flash A/D converter 10 operates by comparing the input analog signal against a large number of linearly increasing reference voltage levels in parallel. A nine bit flash A/D converter consists of 512 (or $2^9$) distinct analog voltage comparators 14. The one of the comparators 14(1) to 14(x) with the highest reference voltage in comparison to the particular voltage level of a given input analog signal determines which one of the inputs I(1) to I(x) of the logic 12 encodes the output O thereof in the converter 10. With the conventional parallel flash A/D converter 10, the number of comparators 14 required doubles with each increment in bit resolution so that building a very high resolution flash converter is not feasible. The largest practical parallel flash converters are about nine bits wide (or x=512).

A first feature of the present invention provides a modification to the conventional flash A/D converter 10 which precludes the necessity to provide a linearly-proportionately larger number of comparators to accommodate high resolution requirements. In this feature of the present invention, the resistors 20(1) to 20(x) in the divider string 18 are of graduated, unequal values. For example, the resistor values may be related as a geometric progression, such as B, $B^2$, $B^3$, ..., $B^{n-1}$. The result of the use of such resistor values is an A/D conversion process which provides a form of data compression; large value and small value measurements will have essentially the same fractional resolution. The A/D conversion that results is non-linear. Thus, this first feature of the invention is directed to a non-linear data compression and conversion arrangement.

The ratio between resistor values determines the degree of data compression that results in the modified A/D converter 10. If "m" is the equivalent number of bits at the analog input to the modified A/D converter 10 as representing the required signal dynamic range and "n" is the actual number of bits at the digital output, then the ratio between resistor values, "B", can be determined. The resolution can be expressed in an equation relating the input and output as follows:

$$\frac{1}{2^m} = \frac{B}{\sum_{i=1}^{2^n} B^i}$$

Recognizing the indicated summation as a geometric progression then simplifying yields:

$$\frac{1}{2^m} = \frac{B}{\frac{B - B^{2^n+1}}{1 - B}} = \frac{B - B^2}{B - B^{2^n+1}} = \frac{1 - B}{1 - B^{2^n}}$$

Now cross multiplying and rearranging give:

$$B^{2^n} - 2^m B + 2^m - 1 = 0.$$

This relation has been solved numerically for B given values for m and n. For example, for what may be a practical case with m=14 and n=9, B solves to the value, 1.0100255; each successive resistor is slightly more than 1% greater than its neighbor below. The result is a data converter which compresses data of wide dynamic range into an output bit range suitable for fast parallel flash A/D conversion.

With this conversion scheme, digitizing error is proportional to the measured value whereas for a linear converter digitizing error is constant. For a real measurement value, "V", the digitizing error can be thought of in terms of the distance between neighboring digital values on the scale. This is approximately plus or minus $V(1-B)/2$. The effect of this digitizing error is to limit the accuracy of a conversion to a fixed proportion of the measured value; for the example case with B=1.0100255, the digitizing error computes to plus or minus 0.5% for a full scale conversion. By contrast a linear nine bit full scale conversion would have a digitizing error of plus or minus one half part in two to the ninth or approximately plus or minus 0.1%. The increased digitizing error is an acceptable price to pay for the advantage of a practical fast conversion technique.

Digital signal processing algorithms, such as the discrete fourier transforms, cannot operate on compressed scale data since such a compression introduces extraneous frequency components. A second feature of the present invention is directed to a data decompression and scaling arrangement which can decompress previously compressed digital signals and limit the digital data width of such signals in systems which have input dynamic range requirements greater than their output resolution requirements.

Figure 2:
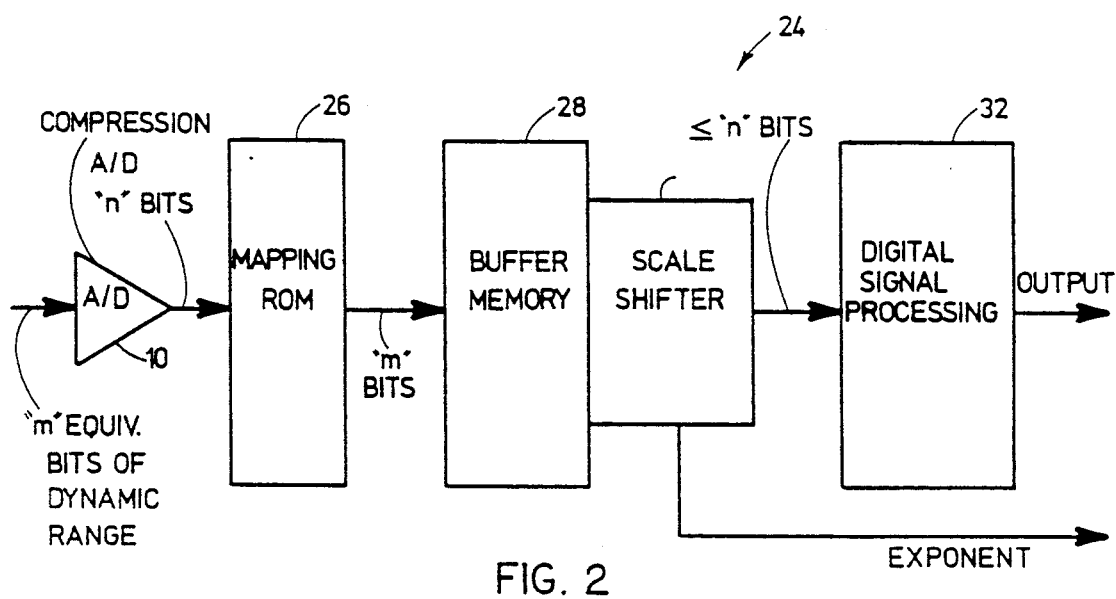
FIG. 2 is a schematic block diagram of a data decompression and scaling arrangement constituting another feature of the present invention which is located downstream of the data conversion and compression arrangement.

Referring to FIG. 2, the data decompression and scaling arrangement 24 of this second feature preferably comprises a mapping ROM 26 for decompressing digital data in combination with a buffer memory 28 and a scale shifter 30 at the output of the buffer memory 28 for scaling up or down the buffer memory output bit range. The mapping ROM 26 is located downstream of the modified flash A/D converter 10 employing the data conversion and compression arrangement constituting the above-described first feature of the invention.

The n bit wide data from the compression converter, the modified flash A/D converter 10, is therefore decompressed by means of the mapping ROM 26 back to a scale of m bits. The required bit capacity of the mapping ROM 26 is m times two to the nth power; for the example case this is 7,168 bits (14×512), a practical size ROM.

For computation of the discrete fourier transform, as with many other digital signal processes, data must be collected as a block before beginning the transform process. The buffer memory 28 in FIG. 2 provides the storage area for collecting data samples. Not all m bits stored in the buffer memory registers are significant; the actual number of significant bits (those which contain data greater than the digitizing noise) is somewhat less than n.

Digital signal processing is performed only on the significant bits by including at the output of the buffer memory 28, the scale shifter 30 which is capable of scaling up or down the buffer memory output bit range. The scaling is based on the largest value in the buffer memory 28. The scaling is adjusted so that the most significant bit at the output corresponds to the most significant bit of the largest value in the buffer memory.

The digital signal processing algorithm thus operates only on the significant bits in the data. This results in a reduction in the digital hardware required. The savings in digital circuitry can actually be greater than the obvious ratio of saved data width since some digital computational functions such as "carry look forward" and "parallel multiply" have circuit requirements which are geometrically related to data width. The scale shift determined at the buffer memory 28 is recorded and applied at the output of the digital signal processing block 32 as an output scale factor or exponent.

In summary, the features of the present invention advantageously: (1) provide a circuit means to compress data while performing a fast A/D conversion which requires no additional hardware over conventional parallel flash A/D conversion techniques; (2) utilize graduated resistor values in a flash A/D converter to effect compressed data conversion; (3) provide a means of performing a compressed A/D conversion of data with circuit complexity budgeted in terms of resolution requirements rather than in terms of dynamic range requirements; (4) utilize a ROM to decompress digital data which has been compressed in an A/D conversion process thereby eliminating spectral distortion; (5) provide a means for reducing the computational data width of digital signal processing data with wide dynamic range requirements but with lesser output resolution requirements; and (6) utilize a shifter at the output of a buffer memory to scale digital data to the significant data bits in the memory block.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

I claim:

1. A data acquisition arrangement for a data signal processing system, comprising:
    a non-linear data compression and conversion arrangement, said arrangement including
    (a) means for converting an analog signal to a digital signal,
    (b) means for defining a multiplicity of graduated reference voltages of unequal values relative to one another operatively associated with an input to said converting means, and
    (c) means operatively disposed between an output of said defining means and the input to said converting means for comparing an analog signal concurrently to said multiplicity of granduated reference voltages and providing a non-liner compressed analog signal to said converting means as a result of the comparison for producing said digital signal in the form of a compressed conversion of said analog signal; and
    a data decompression and scaling arrangement connected to and located downstream of said converting means of said data compression and conversion arrangement for receiving said compressed digital signal from said converting means and for decompressing and scaling said compressed digital signal so as to provide only the most significant bits of a decompressed digital signal for data signal processing.

2. The arrangement of claim 1 wherein said converting means is an encoding logic for converting an analog signal to a digital signal and having a plurality of inputs for receiving the analog signal and an output for producing the digital signal.

3. The arrangement of claim 1 wherein said comparing means is a multiplicity of comparators having outputs and first and second sets of inputs, said comparators being connected at said outputs to inputs of said converting means, said first sets of inputs of said comparators being connected in parallel to receive an analog input.

4. The arrangement of claim 1 wherein said reference voltage defining means is a divider string of series connected and grounded resistors having graduated, unequal values relative to one another and being connected to said comparing means so as to define said granduated reference voltages.

5. The arrangement of claim 1 wherein said unequal values of said granduated reference voltages are related to one another as a geometric progression.

6. A data acquisition arrangement for a data signal processing system, comprising:
    a non-linear data compression and conversion arrangement, said arrangement including
    (a) encoding logic for converting analog signals to digital signals and having a plurality of inputs for receiving the analog signals and an output for producing the digital signals,
    (b) a multiplicity of comparators having outputs and first and second sets of inputs, said comparators being connected at said outputs to said inputs of said encoding logic, said first sets of inputs of said comparators being connected in parallel to receive a common analog input, and
    (c) a divider string of series connected and grounded resistors having graduated, unequal values relative to one another and being connected to said second set of inputs of said comparators so as to define graduated reference voltages which provide a non-linear compression of said analog signals at said inputs of said logic and thereby a compressed conversion of said analog signals to said digital signals by said logic; and
    a data decompression and scaling arrangement connected to and located downstream of said encoding logic of said data compression and conversion arrangement for receiving said compressed digital signal from said encoding logic and for decompressing and scaling said compressed digital signal so as to provide only the most significant bits of a decompressed digital signal for data signal processing.

7. The arrangement of claim 6 wherein said unequal values of said graduated reference voltages are related to one another as a geometric progression.

8. A data decompression and scaling arrangement for a data signal processing system, comprising:
    (a) means for decompressing digital data;
    (b) means for storing the decompressed digital data; and
    (c) means for receiving the decompressed digital data from said storing means and for scaling up or down the output bit range of said storing means.

9. The arrangement of claim 8 wherein said decompressing means is a mapping ROM for decompressing n bit wide data back to a scale of m bits where m is greater than n.

10. The arrangement of claim 9 wherein the capacity of said mapping ROM is m times two to the nth power.

11. The arrangement of claim 8 wherein said storing means is a buffer memory.

12. The arrangement of claim 8 wherein said scaling means is a scale shifter wherein the scaling is based on the largest value in said storing means and is adjusted so that the most significant bit at the output of said scale shifter corresponds to the most significant bit of the largest value in said storing means.

13. A data decompression and scaling arrangement for a data signal processing system, comprising:
   (a) a mapping ROM for decompressing n bit wide data back to a scale of m bits where m is greater than n;
   (b) a buffer memory for storing the decompressed digital data; and
   (c) a scale shifter for receiving the decompressed digital data from said buffer memory and for scaling up or down the output bit range thereof.

14. A data acquisition arrangement for a data signal processing system comprising:
   (a) a non-linear data compression and conversion arrangement, said arrangement including
      (i) means for converting an analog signal to a digital signal,
      (ii) means for defining a multiplicity of graduated reference voltages of unequal values relative to one another, and
      (iii) means for comparing an analog signal concurrently to said multiplicity of graduated reference voltages and providing a non-linear compressed analog signal to said converting means as a result of the comparison for producing said digital signal in the form of a compressed conversion of said analog signal; and
   (b) a data decompression and scaling arrangement connected to and located downstream of said data compression and conversion arrangement for receiving said compressed digital signal therefrom, said arrangement including
      (i) means for decompressing said compressed digital signal,
      (ii) means for storing the decompressed digital signal, and
      (iii) means for receiving the decompressed digital signal from said storing means and for scaling up or down the output bit range of said storing means so as to provide only the most significant bits of said decompressed digital signal for data signal processing.

15. The method of data acquisition for a signal processing system comprising the steps of:
   a. supplying a multiplicity of graduated reference voltages of unequal value relative to one another;
   b. receiving said multiplicity of graduated reference voltages and an analog signal and comparing said analog signal concurrently to said multiplicity of graduated reference voltages and producing a non-linear compressed analog signal;
   c. receiving said non-linear compressed analog signal and converting said compressed analog signal to a compressed digital signal; and
   d. receiving said compressed digital signal and decompressing and scaling said compressed digital signal so as to provide only the most significant bits of a decompressed digital signal for data signal processing.

16. The method of data decompression and scaling for a signal processing system comprising the steps of:
   a. employing a mapping ROM to decompress input digital data;
   b. storing said digital data in a buffer memory; and
   c. receiving said stored digital data from said buffer memory and scaling the output bit range of said received digital data up or down.

17. The method of non-linear data compression and conversion, and decompression and scaling comprising the steps of:
   a. comparing an input analog signal against a series of graduated, unequal reference signal values and producing a non-linear compressed analog signal,
   b. converting said compressed analog signal to a compressed digital signal by means of encoding logic,
   c. decompressing said digital signal in a mapping ROM from n bit wide data to a scale of m bits, where m is greater than n,
   d. storing said decompressed data in a buffer memory,
   e. receiving the output of said buffer memory and scaling the output bit range of said buffer based on the largest value in said buffer memory adjusting said scaling so that the most significant bit of said scaled output corresponds to the most significant bit of the largest value in said buffer memory.

* * * * *